United States Patent [19]

Endler et al.

[11] Patent Number: 5,208,554
[45] Date of Patent: May 4, 1993

[54] HIGH POWER COMPACT MICROWAVE AMPLIFIER

[75] Inventors: Harvey Endler, Van Nuys; Hadi Mojaradi, Los Angeles, both of Calif.

[73] Assignee: Systron Donner Corporation, Sylmar, Calif.

[21] Appl. No.: 825,194

[22] Filed: Jan. 24, 1992

[51] Int. Cl.⁵ .............................................. H03F 3/68
[52] U.S. Cl. ................................... 330/295; 330/124 R; 330/289; 330/84; 330/65
[58] Field of Search ..................... 330/295, 124 R, 84, 330/289, 65, 66, 277; 361/383, 384, 386, 387, 388; 363/141; 357/81

[56] References Cited

U.S. PATENT DOCUMENTS

| 4,320,349 | 3/1982 | Freers et al. | 330/289 |
| 5,066,924 | 11/1991 | Wendt | 330/295 |
| 5,111,157 | 5/1992 | Komiak | 330/295 |

OTHER PUBLICATIONS 1-2 GHz High-Power Linear Transistor Amplifier, Presser et al RCA Review, vol. 33, Dec. 1972, pp. 737-751.

Primary Examiner—Robert J. Pascal
Assistant Examiner—Tan Dinh
Attorney, Agent, or Firm—Flehr, Hohbach, Test, Albritton & Herbert

[57] ABSTRACT

A Class A high power amplifier having an operating frequency in the range of less than substantially 2 GHz and suitable for aircraft use, is all solid state in that gallium arsenide field effect transistors are utilized. These are mounted in a large copper heat sink which is air cooled to provide for overall cooling by conduction and convection. By the use of microstrip matching circuits, the relatively low impedance of the gallium arsenide FET units is matched to the required higher system impedance. At the same time a 40% band-width is provided due to the superior matching.

6 Claims, 4 Drawing Sheets

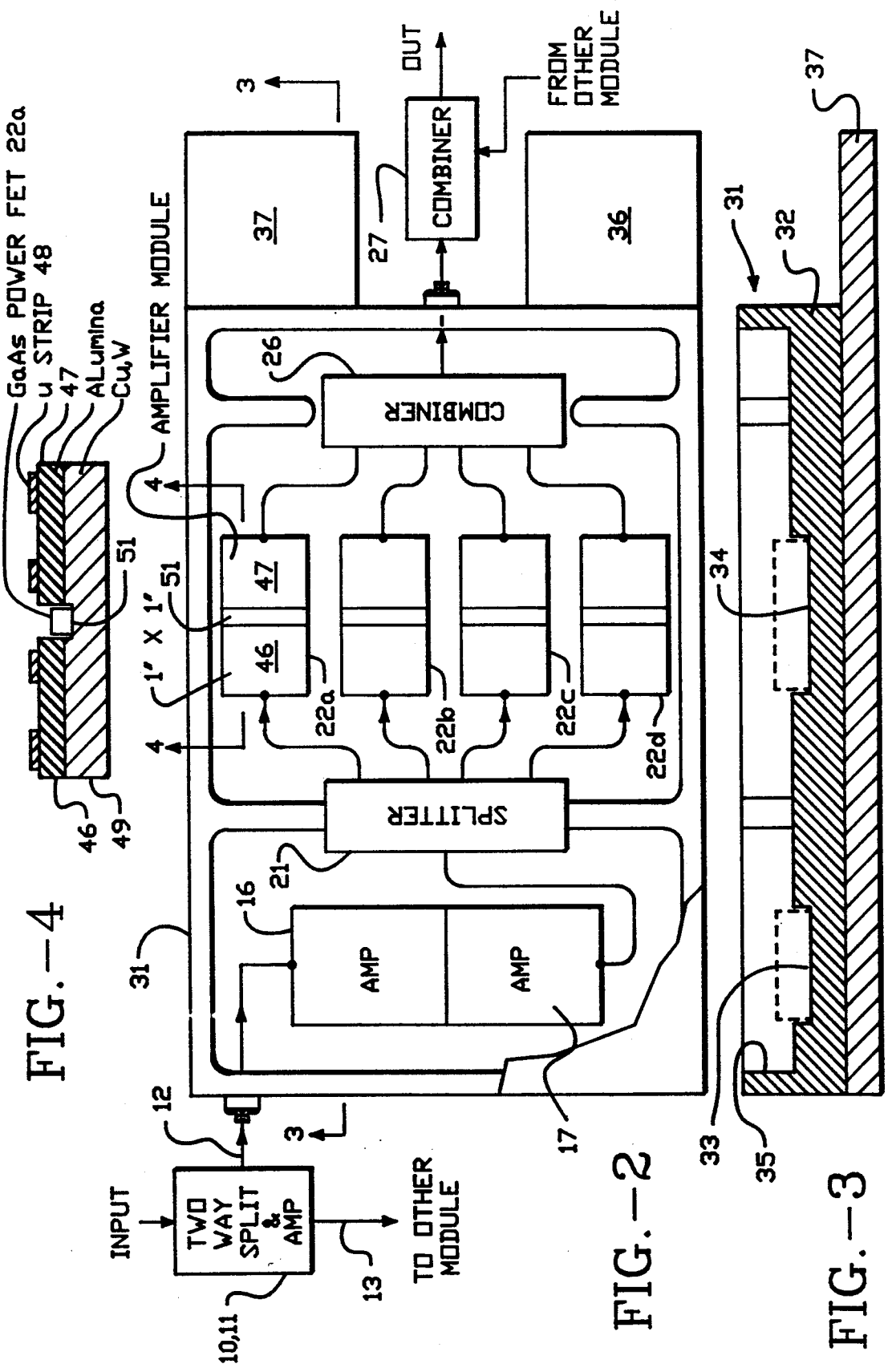

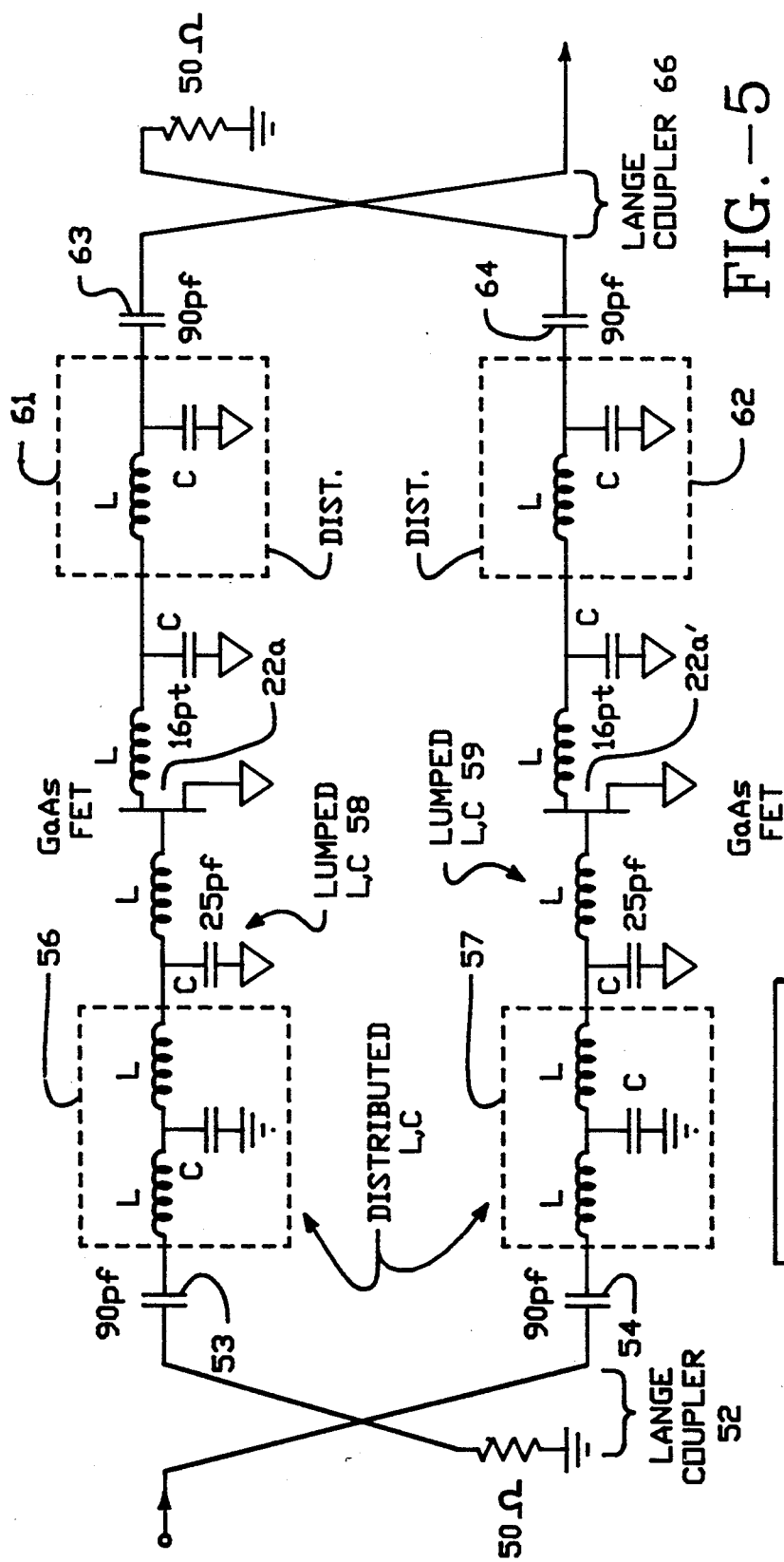
FIG.−5
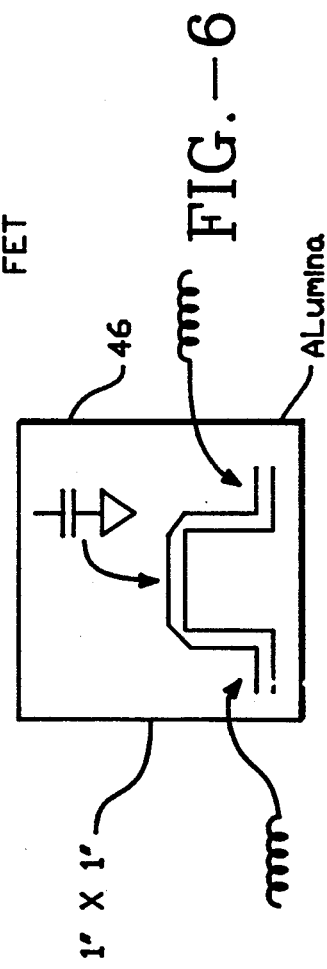
FIG.−6

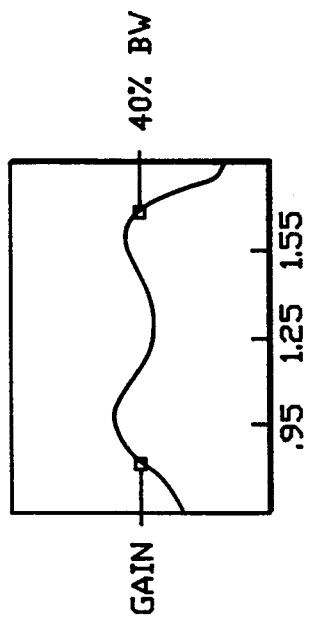
FIG.—7
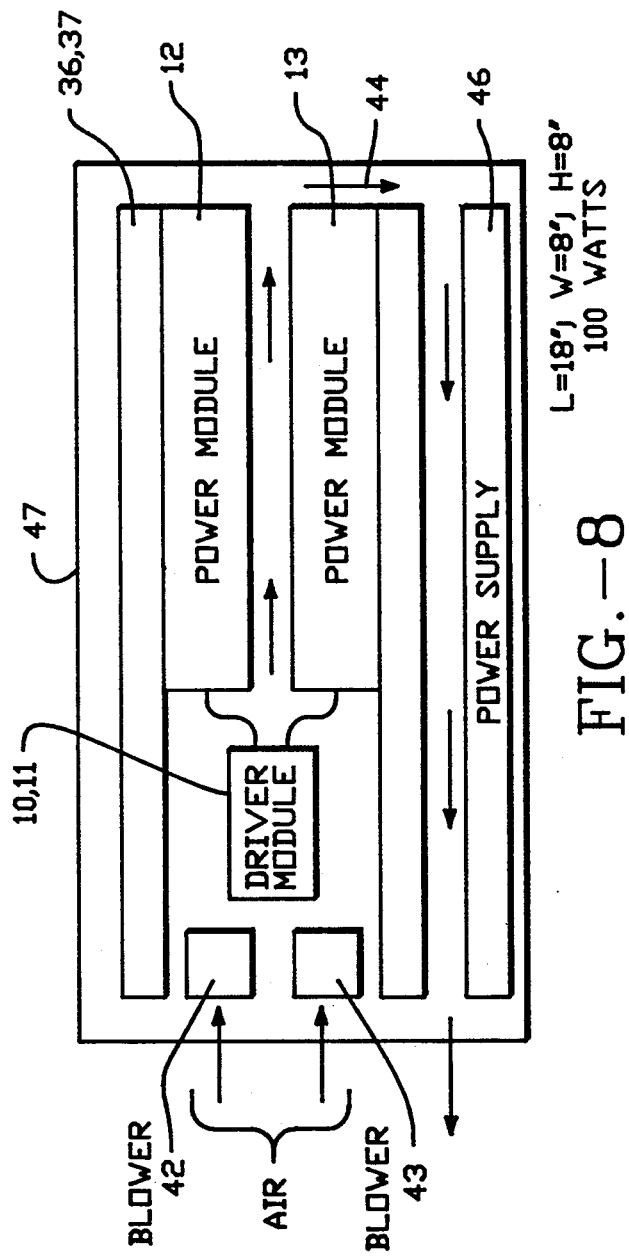
FIG.—8

1

HIGH POWER COMPACT MICROWAVE AMPLIFIER

BACKGROUND OF THE INVENTION

The present invention is directed to a high power compact microwave amplifier and more particularly to an amplifier of the solid state type which is relatively compact for airplanes and the like.

In generating high power microwave signals, for example, in the GHz range and of 100 watts or more, conventional traveling wave tubes have been used. In addition to the obvious fragility of such a tube compared to the solid state unit, the space required is excessive. Solid state high power amplifiers are available but they are either not Class A (in other words they do not operate full time but are on and off type units) and for the solid state unit devices used for power amplification are the silicon bipolar type which are space consuming and have many limitations as far as speed and noise and efficiency.

OBJECT AND SUMMARY OF THE INVENTION

It is therefore a general object of the present invention to provide an improved high power compact microwave amplifier.

In accordance with the above object there is provided a class A power amplifier having an operating frequency in the range of less than substantially 2 GHz comprising plurality of parallel connected gallium arsenide (GaAs) field effect transistors (FETs) providing a high power output in the range of 100 watts or more, the FETs have a relatively low input and output impedance compared to a required normal system impedance. A microstrip matching circuit is mounted on a dielectric substrate for matching the relatively high system impedance to the input and output impedance of the FETs. A conductive base provides a thermal expansion match with said dielectric substrate, the thermal matching base also providing a direct mounting surface for the plurality of FETs. Heat sink means cooling the FETs include a unitary copper aircooled base in which the FETs are inset via the thermal matching base whereby cooling is accomplished by convection and conduction. Air blower means provide the cooling air.

BRIEF DESCRIPTION OF THE DRAWINGS

FIG. 2 is a simplified plan view of a portion of the amplifier of the present invention.

FIG. 3 is a simplified cross sectional view taken substantially along the line 3—3 of FIG. 2.

FIG. 4 is a simplified cross sectional view taken substantially along the line 4—4 of FIG. 2.

FIG. 5 is a circuit schematic of a portion of FIG. 1 and FIG. 2.

FIG. 6 is a simplified schematic showing of a microstrip circuit shown in FIG. 4 in cross section.

FIG. 7 is a curve showing the electrical performance of the amplifier of the present invention, and FIG. 8 is a simplified cross section showing the overall packaging of the present invention in a unitary container as it would be installed on an aircraft, for example.

DETAILED DESCRIPTION OF PREFERRED EMBODIMENT

Figure 1:
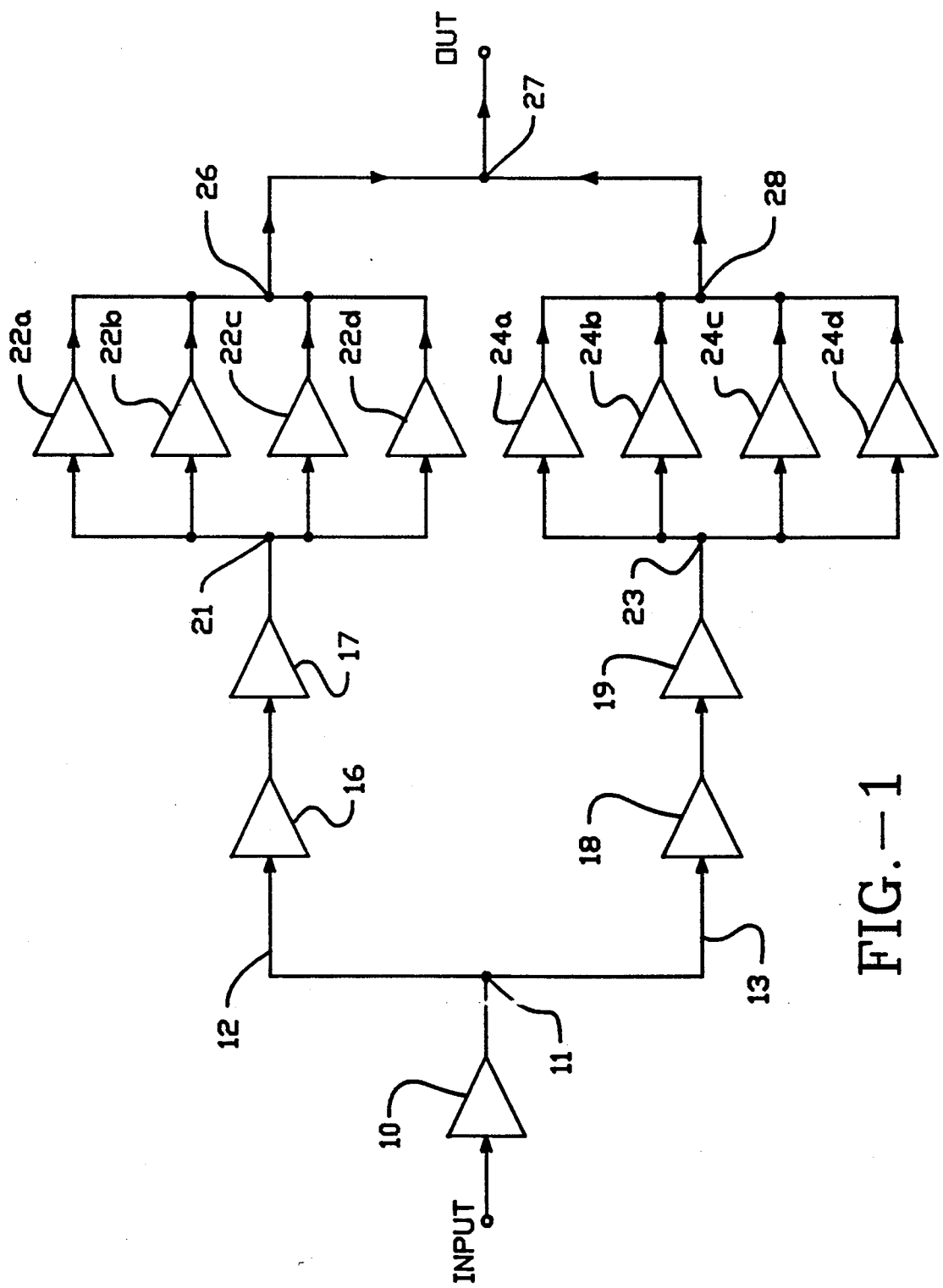
FIG. 1 is a schematic circuit diagram embodying the present invention.

From a circuit schematic point of view, as illustrated in FIG. 1, the amplifier of the present invention includes a driver amplifier 10 which receives the basic desired operating signal in the frequency range of 1 GHz to 1.5 GHz and amplifies it to, for example, the 100 watt range. Such amplifier typically includes bipolar silicon transistors. A two-way phase splitter is indicated by the dot at 11.

The output of amplifier 10 is split between an upper power module path 12 and a lower power module path 13. In general these individual signals are amplified and matched in phase and then recombined at the output to provide a power level of substantially 100 watts. Each power module path 12 and 13 includes the series connected driver stages 16 and 17 and 18 and 19. At the output of amplifier 17 is a four way phase splitter indicated by the dot 21 which provides an input to 4 gallium arsenide (GaAs) type power field effect transistors (FETs) 22a through 22d. Similarly at the output of amplifier driver 19 another four way splitter 23 which drives the gallium arsenide FETs 24a-24d.

The outputs of amplifiers 22a through 22d are combined by a combiner indicated by the dot 26 and then at 27 there is a two way isolated power combiner 27 which combines the signals form the lower power module 13 which are combined at 28.

FIG. 2 illustrates the upper power module 12 with all of the amplifiers, etc. being identified by a similar number. To provide heat dissipation, all of the elements 16, 17, 21, 22a-22d and 26 are arranged on a substantially 100% copper heat sink 31. This is better shown in cross section in FIG. 3 where the heat sink includes a relatively thick copper base 32 having the insets 33 and 34 for various components and then a rectangular surrounding wall 35.

More specifically with regard to inset 33, the amplifier units 16 and 17 are placed therein to make good contact with the heat conducting copper. And most importantly, there are four insets 34 which receive the amplifier modules 22a-22d. The entire copper base 32 is mounted on a pair of metal support plates 36 and 37.

The other power module 13 is of identical construction. Very briefly, as illustrated in FIG. 8, when packaged in a common cabinet 41, the modules 12 and 13 are placed in a back-to-back relationship as indicated. Still referring to FIG. 8, the driver module 10, 11 is indicated and a pair of blowers 42,43 provides for convection cooling over the tops of the modules with the air, as shown by the vector 44 turning and then passing over a power supply unit 46. Thus in conjunction with convection cooling from the air and the mounting in the copper base 32 of FIG. 3, a very efficient and high cooling capacity is provided.

Referring back to FIG. 2, each of the amplifier modules 22a-22d includes, now referring also to FIG. 4, a pair of dielectric or alumina substrates 46 and 47 having a dimension of about 1 inch by 1 inch to provide for sufficient space for the microstrip line 48 placed thereon. (This is where matching is accomplished as will be described below). And then both dielectric or alumina substrates are supported by a conductive base 49 which has a thermal co-efficient of expansion which matches the dielectric substrate. In this case, the preferred dielectric is alumina (it could be sapphire or beryllium oxide). The substrate 49 is made of a copper tungsten powdered metal. One type of such powdered metal which very accurately matches the thermal expansion characteristics of alumina (which matching is especially necessary with the relatively large dimensions needed for the stripline because of the lower GHz frequency) is sold under the trademark THERMKON by CMW, Inc. of Minneapolis, Minn. Besides thermal matching, it provides good thermal conductivity which is necessary since the matching base 49 is inset with close tolerances into the insets 34 as illustrated in FIG. 3 to provide good thermal conductivity with the copper.

Furthermore, to provide needed heat dissipation capability, the gallium arsenide field effect transistors 22a-22d are placed in the groove or central portion 51 of the base 49 in direct contact with the metal. For each amplifier module 22a-22d (24a-24d), there are a pair of field effect transistors in this groove 51. A typical amplifier module is shown in FIG. 5. Here, the pair is a first FET 22a and a second FET 22a'. Mounted on each of the substrates 46 and 47 are all of the inductors and capacitors, (L, C) shown in FIG. 5. Some are distributed in the form of a microstrip and others are placed on the substrate as a lumped unit. For example, in the case of a lumped capacitor, a single layered chip capacitor. Matching is very important since in amplifiers of this type, since as indicated by the input and output of FIG. 5, there are 50 ohm resistors and this is the desired system impedance. However, the input and output impedances of a gallium arsenide field effect transistor normally is in the range of 2 to 3 ohms. Thus, this must be effectively matched to provide for a wide bandwidth especially at the lower GHz frequency utilized in the present invention. Also no feedback technique is desired for matching since this lowers efficiency. The desired output of the amplifier is illustrated in FIG. 7 where as indicated with the bandwidth of substantially 500 megahertz and a center frequency of 125 megahertz in a Class A amplifier featuring a 40% bandwidth is provided.

Referring to the specific matching now illustrated in FIG. 5, for the input to amplifier module 22a the Lange input coupler 52 provides the 50-ohm input impedance. With the pair of coupling capacitors 53 and 54, the input is coupled to the distributed L, C circuits 56 and 57. Typically such distributed circuit is a U-shaped strip, for example, on the substrate 46, as illustrated in FIG. 6, where the inductive portions provided by the strip are indicated at the ends and the capacitor as the middle portion of the U. From a practical standpoint when the circuit is designed for a particular frequency range, such a microstrip is tested over the frequency range and adjusted by bench tuning to provide the exact configuration. Each distributed circuit drives a lump L C circuit indicated at 58 and 59 which is the gate input of the field effect transistors 22a and 22a'. The purpose of the lumped circuits, while providing a smaller size than the microstrip circuits, is to reduce dispersion and frequency dependence.

On the output side of the field effect transistors, there are again lump capacitors which may have a value of 16 pf, indicated, and inductances which merely may be parasitic. Then in series are second L, C distributed circuits 61 and 62, the coupling capacitors 63 and 64, and output Lange coupler 66. The output side of the FET circuit is, of course, arranged on the second dielectric substrate 47, as shown in FIGS. 2 and 4.

In summary, the present invention provides an improved solid state replacement for travelling wave tubes in a high power compact microwave amplifier. This is accomplished as outlined above by effective use of gallium arsenide field effect transistors which have high power capabilities, high speed and ideal circuit characteristics (such as no DC bias being required for this type of amplifier). In addition, effective heat dissipation is proovided by the unique mechanical mounting configuration and heat sinks selected.

What is claimed:

1. A class A power amplifier having an operating frequency in the range of less than substantially 2 GHz comprising:
   a plurality of parallel connected gallium arsenide (GaAs) field effect transistors (FETs) providing a high power output in the range of at least 100 watts, said FETs having a relatively low input and output impedance compared to a required normal relatively high system impedance;
   a microstrip matching circuit mounted on a dielectric substrate for matching said relatively high system impedance to said input and output impedance of said FETs, each substrate being dimensioned in accordance with the frequency 2 GHz or less, said substrates being substantially 1 by 1 inch in size; a plurality of conductive bases for providing a thermal expansion match with said dielectric substrate, said conductive bases also providing a direct mounting surface for said plurality of FETs, each of said bases carrying a pair of said FETs along with said microstrip matching circuits carried on said dielectric substrates;
   heat sink means for cooling said FETs including a unitary copper base in which said FETs are inset via said conductive base whereby cooling is accomplished by at least conduction.

2. A power amplifier as in claim 1 in which the relatively low input and output impedances of said GaAs, FETs are in the range of 2 to 3 ohms and said required normal relatively high system impedance is 50 ohms.

3. A power amplifier as in claim 1 in which said microstrip matching circuit includes distributed inductive and capacitive elements in microstrip form on said dielectric substrates.

4. A power amplifier as in claim 3 where said matching microstrip circuit includes a U-shaped configuration for providing said inductive and capacitive elements.

5. A power amplifier as in claim 1 in which said microstrip matching circuit also includes in addition to said elements in microstrip form, lumped inductor and capacitor units placed on said dielectric substances.

6. A power amplifier as in claim 1 including air blower means for providing convection cooling for said heat sink means.

* * * * *